US012571953B2

(12) United States Patent
Yamamoto et al.

(10) Patent No.: US 12,571,953 B2
(45) Date of Patent: Mar. 10, 2026

(54) POLARIZING FILM HAVING PRESSURE-SENSITIVE ADHESIVE LAYER WITH SPECIFIED SATURATED MOISTURE CONTENT

(71) Applicant: NITTO DENKO CORPORATION, Ibaraki (JP)

(72) Inventors: Shinya Yamamoto, Ibaraki (JP); Tomohiro Yamashita, Ibaraki (JP); Sho Takarada, Ibaraki (JP); Takahiro Nonaka, Ibaraki (JP); Katsunori Takada, Ibaraki (JP); Yusuke Toyama, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 660 days.

(21) Appl. No.: 17/800,137

(22) PCT Filed: Feb. 4, 2021

(86) PCT No.: PCT/JP2021/004091
§ 371 (c)(1),
(2) Date: Aug. 16, 2022

(87) PCT Pub. No.: WO2021/166659
PCT Pub. Date: Aug. 26, 2021

(65) Prior Publication Data
US 2023/0072725 A1 Mar. 9, 2023

(30) Foreign Application Priority Data
Feb. 17, 2020 (JP) ................................. 2020-024426

(51) Int. Cl.
*C09J 7/38* (2018.01)
*G02B 1/14* (2015.01)
(Continued)

(52) U.S. Cl.
CPC ............. *G02B 5/3025* (2013.01); *G02B 1/14* (2015.01); *G02B 5/3041* (2013.01); *G02B 7/006* (2013.01);
(Continued)

(58) Field of Classification Search
CPC . B32B 7/12; C09J 7/38; G02B 5/3025; G02B 5/3041; G02B 27/28; G02F 1/133528; G02F 2202/28
See application file for complete search history.

(56) References Cited

U.S. PATENT DOCUMENTS

2009/0324944 A1    12/2009  Toyama et al.
2013/0094083 A1*    4/2013  Ishii ......................... G02B 5/30
                                                        428/354
(Continued)

FOREIGN PATENT DOCUMENTS

CN         104422979  A      3/2015
JP         2009-117406  A     5/2009
(Continued)

OTHER PUBLICATIONS

English translation of Komatsu, JP 5823154 B2 retrieved from https://worldwide.espacenet.com on Jun. 22, 2025 (Year: 2025).*
(Continued)

*Primary Examiner* — Ryan S Dunning
(74) *Attorney, Agent, or Firm* — Sughrue Mion, PLLC

(57) ABSTRACT

A polarizing film having a pressure-sensitive adhesive layer, said polarizing film comprising a polarizer film and a first transparent protective film, wherein a first pressure-sensitive adhesive layer is provided on the first transparent protective film side of the polarizing film. The polarizer film has a film thickness of 20 μm or less; the first pressure-sensitive adhesive layer is used for the bonding of a front transparent member that is arranged at the viewing side of an image
(Continued)

110 display device, while having a difference between the saturation moisture percentage (A) at 80° C. at 85% R.H. and the saturation moisture percentage (B) at 25° C. at 50% R.H., namely ((A)–(B)) of 1.0% by weight or more. This polarizing film having a pressure-sensitive adhesive layer is able to suppress decrease in the single transmittance of the polarizing film in a high temperature environment.

8 Claims, 1 Drawing Sheet

(51) Int. Cl.

| | |
|---|---|
| *G02B 5/30* | (2006.01) |
| *G02B 7/00* | (2021.01) |
| *G02F 1/1335* | (2006.01) |
| *H10K 59/80* | (2023.01) |

(52) U.S. Cl.
CPC ............ *H10K 59/8791* (2023.02); *C09J 7/38* (2018.01); *G02F 1/133528* (2013.01); *G02F 2202/28* (2013.01)

(56) References Cited

U.S. PATENT DOCUMENTS

| | | | | |
|---|---|---|---|---|
| 2015/0062705 | A1 | 3/2015 | Toyama et al. | |
| 2015/0070603 | A1 | 3/2015 | Yamasaki et al. | |
| 2015/0346408 | A1 | 12/2015 | Mizutani et al. | |
| 2016/0109631 | A1 | 4/2016 | Mizutani et al. | |
| 2016/0237319 | A1* | 8/2016 | Takarada | B32B 7/06 |
| 2016/0252660 | A1 | 9/2016 | Matsuno et al. | |
| 2017/0101553 | A1 | 4/2017 | Takarada et al. | |
| 2019/0271879 | A1* | 9/2019 | Yamasaki | C09J 133/14 |
| 2020/0301058 | A1* | 9/2020 | Kishi | G02B 1/14 |

FOREIGN PATENT DOCUMENTS

| | | | |
|---|---|---|---|
| JP | 2010-197681 | A | 9/2010 |
| JP | 2012-215888 | A | 11/2012 |
| JP | 2012-220764 | A | 11/2012 |
| JP | 2014-102353 | A | 6/2014 |
| JP | 2015-114386 | A | 6/2015 |
| JP | 5823154 | B2 * | 11/2015 |
| JP | 2016-080830 | A | 5/2016 |
| JP | 5976969 | B1 | 8/2016 |
| JP | 2017-075998 | A | 4/2017 |
| JP | 2018-053066 | A | 4/2018 |
| JP | 2018-101117 | A | 6/2018 |
| KR | 10-2019-0015236 | A | 2/2019 |

OTHER PUBLICATIONS

International Preliminary Report on Patentability with the translation of Written Opinion dated Aug. 23, 2022 from the International Bureau in International Application No. PCT/JP2021/004091.
International Search Report for PCT/JP2021/004091 dated Mar. 16, 2021 [PCT/ISA/210].
First Office Action issued Jun. 22, 2024 in Chinese Application No. 202180015021.9.
Communication dated Aug. 30, 2024, issued in Taiwanese Application No. 110104779.
Request for the Submission of an Opinion dated Sep. 11, 2024, issued in Korean Application No. 10-2022-7030464.
Notice of Reasons for Refusal issued Nov. 21, 2024 in Japanese Application No. 2021-015821.
Notice of Second Office Action dated Jan. 4, 2025 in Chinese Application No. 202180015021.9.
Extended European Search Report dated Jul. 26, 2023 in European Application No. 21756189.3.
Office Action issued Apr. 10, 2025 in Japanese Application No. 2021-015821.
Communication issued May 26, 2025 in Korean Application No. 10-2022-7030464.
Communication issued Aug. 6, 2025 in European Application No. 21756189.3.

\* cited by examiner

POLARIZING FILM HAVING PRESSURE-SENSITIVE ADHESIVE LAYER WITH SPECIFIED SATURATED MOISTURE CONTENT

CROSS REFERENCE TO RELATED APPLICATIONS

This application is a National Stage of International Application No. PCT/JP2021/004091 filed Feb. 4, 2021, claiming priority based on Japanese Patent Application No. 2020-024426 filed Feb. 17, 2020.

TECHNICAL FIELD

The present invention relates to a polarizing film having a pressure-sensitive adhesive layer and an image display device.

BACKGROUND ART

Liquid crystal display devices and organic EL display devices are widely used as various image display devices such as mobile phones, smartphones, car navigation devices, personal computer monitors, and televisions. As a polarizing layer of these various image display devices, a dyed polyvinyl alcohol film (containing a dichroic substance such as iodine and a dichroic dye) is used because the dyed polyvinyl alcohol film has both a high transmission rate and a high degree of polarization. The polarizing layer is usually used as a polarizing film (polarizing plate) in which a protective film of triacetyl cellulose or the like is bonded to one surface or both surfaces of the polarizing layer using an adhesive.

In the various image display devices, a front transparent plate (also referred to as a "cover window", a "window layer" and the like) such as a transparent resin plate and a glass plate may be provided on the viewing side of an image display panel for the purpose of, for example, preventing damage to the image display panel due to impact from the outer surface. In recent years, devices having a touch panel on a viewing side of an image display panel have been widely used.

As a method of disposing a front transparent member such as a front transparent plate and a touch panel on a front of an image display panel, an "interlayer filling structure" has been proposed in which an image display panel and a front transparent member are bonded to each other with a pressure-sensitive adhesive layer interposed therebetween. A pressure-sensitive adhesive layer may also be provided between a touch panel and a front transparent plate. In the interlayer filling structure, because voids between members are filled with the pressure-sensitive adhesive layer, a difference in refractive indexes at the interface is reduced, and deterioration in visibility due to reflection and scattering is suppressed. In addition, in the interlayer filling structure, because the members are bonded to each other and fixed by a pressure-sensitive adhesive layer, there is an advantage that peeling of the front transparent member due to an impact such as dropping hardly occurs as compared with a case where the front transparent member is fixed only to the housing.

Meanwhile, among the various image display devices, in-vehicle displays such as car navigation devices are particularly required to have durability at a high temperature. For example, Patent Documents 1 to 3 describe that when an image display device in which an image display cell and a front transparent member are bonded by interlayer filling using a pressure-sensitive adhesive is subjected to a test for long-time high-temperature durability required for in-vehicle displays, polyvinyl alcohol that constitutes the polarizing layer is polyenized in a high-temperature environment, whereby the single transmittance of the in-plane central portion of the polarizing film that constitutes an image display panel is reduced. In particular, it is pointed out that polyenization is promoted by moisture contained in the polarizing film, and as the in-plane size of the polarizing layer increases, the single transmittance tends to decrease significantly.

PRIOR ART DOCUMENTS

Patent Documents

Patent Document 1: JP-A-2017-75998
Patent Document 2: JP-A-2014-102353
Patent Document 3: JP-A-2018-101117

SUMMARY OF THE INVENTION

Problems to be Solved by the Invention

Patent Document 1 above discloses that a polarizing film capable of suppressing a decrease in single transmittance in a high-temperature environment can be provided by using a pressure-sensitive adhesive layer (pressure-sensitive adhesive sheet) that is used for bonding a front transparent member disposed on the viewing side of an image display device and a polarizing film and has a specific parameter, Patent Document 2 discloses that the polarizing film can be provided by using a transparent protective film having a specific saturated water absorption amount, and Patent Document 3 discloses that the polarizing film can be provided by using a pressure-sensitive adhesive layer (pressure-sensitive adhesive sheet) that is used for bonding a transparent resin plate disposed on the viewing side of an image display device and a polarizing film and has a specific storage elastic modulus. However, the present inventors have found that the property can be improved by means different from the above.

In view of the above circumstances, an object of the present invention is to provide a polarizing film having a pressure-sensitive adhesive layer capable of suppressing a decrease in single transmittance of a polarizing film in a high-temperature environment, and an image display device including the polarizing film having a pressure-sensitive adhesive layer.

Means for Solving the Problems

That is, the present invention relates to a polarizing film having a pressure-sensitive adhesive layer, including: a first pressure-sensitive adhesive layer provided on a first transparent protective film side of a polarizing film having a polarizing layer and a first transparent protective film, wherein the polarizing layer has a sheet thickness of 20 μm or less, and the first pressure-sensitive adhesive layer is used for bonding a front transparent member disposed on a viewing side of an image display device and has a difference ((A)−(B)) between a saturated moisture content (A) at 80° C. and 85% R.H. and a saturated moisture content (B) at 25° C. and 50% R.H. of 1.0% by weight or more.

The present invention also relates to a polarizing film having a pressure-sensitive adhesive layer, including: a first pressure-sensitive adhesive layer provided on a first transparent protective film side of a polarizing film having a polarizing layer and a first transparent protective film, wherein the polarizing layer has a sheet thickness of 20 μm or less, and the first pressure-sensitive adhesive layer is used for bonding a front transparent member disposed on a viewing side of an image display device and has a ratio ((A)/(B)) of a saturated moisture content (A) at 80° C. and 85% R.H. to a saturated moisture content (B) at 25° C. and 50% R.H. of 2.5 or less.

The present invention also relates to an image display device, including: an image display cell; and the front transparent member, wherein the polarizing film having a pressure-sensitive adhesive layer is bonded to the front transparent member.

Effect of the Invention

Details of the action mechanism of the effect in the polarizing film having a pressure-sensitive adhesive layer of the present invention are partially unclear, but are estimated as follows. However, the present invention need not be construed as being limited to this action mechanism.

The polarizing film having a pressure-sensitive adhesive layer of the present invention is a polarizing film having a pressure-sensitive adhesive layer, including: a first pressure-sensitive adhesive layer provided on a first transparent protective film side of a polarizing film having a polarizing layer and a first transparent protective film, wherein the polarizing layer has a sheet thickness of 20 μm or less, and the first pressure-sensitive adhesive layer is used for bonding a front transparent member disposed on a viewing side of an image display device and has a difference ((A)−(B)) between a saturated moisture content (A) at 80° C. and 85% R.H. and a saturated moisture content (B) at 25° C. and 50% R.H. of 1.0% by weight or more. A pressure-sensitive adhesive layer having a difference ((A)−(B)) between a saturated moisture content (A) and a saturated moisture content (B) of not less than a certain value, that is, a pressure-sensitive adhesive layer having a difference between a saturated moisture content at high temperature and a saturated moisture content at around normal temperature of not less than a certain value can sufficiently absorb moisture released from, for example, a polarizing film having a polarizing layer having a sheet thickness of 20 μm or less when a polarizing film having a pressure-sensitive adhesive layer in an image display device is exposed to an environment from around normal temperature to high temperature, and thus presumably diffusion of moisture in the image display device can be prevented so that a decrease in single transmittance due to polyenization of the polarizing film in a high-temperature environment can be suppressed.

The polarizing film having a pressure-sensitive adhesive layer of the present invention is a polarizing film having a pressure-sensitive adhesive layer, including: a first pressure-sensitive adhesive layer provided on a first transparent protective film side of a polarizing film having a polarizing layer and a first transparent protective film, wherein the polarizing layer has a sheet thickness of 20 μm or less, and the first pressure-sensitive adhesive layer is used for bonding a front transparent member disposed on a viewing side of an image display device and may have a ratio ((A)/(B)) of a saturated moisture content (A) at 80° C. and 85% R.H. to a saturated moisture content (B) at 25° C. and 50% R.H. of 2.5 or less. A pressure-sensitive adhesive layer having a ratio ((A)/(B)) of a saturated moisture content (A) to a saturated moisture content (B) of not more than a certain value, that is, a pressure-sensitive adhesive layer having a ratio of a saturated moisture content at high temperature to a saturated moisture content at around normal temperature of not more than a certain value can sufficiently absorb moisture released from, for example, a polarizing film having a polarizing layer having a sheet thickness of 20 μm or less when a polarizing film having a pressure-sensitive adhesive layer in an image display device is exposed to an environment from around normal temperature to high temperature, and thus presumably diffusion of moisture in the image display device can be prevented so that a decrease in single transmittance due to polyenization of the polarizing film in a high-temperature environment can be suppressed.

Patent Documents 1 to 3 above point out that the single transmittance of a polarizing film tends to decrease more significantly due to polyenization in a high-temperature environment as the in-plane size of the polarizing layer increases. However, it is not proved at all that polyenization in a high-temperature environment can be suppressed even when a polarizing layer having a large in-plane size (for example, an in-plane size of 300 cm² or more) is used. Furthermore, Patent Documents above do not pay attention to the fact that in order to suppress polyenization in a high-temperature environment even when a polarizing layer having a large in-plane size is used as described above, the thickness of the polarizing layer and the difference between saturated moisture contents or ratio thereof in the first pressure-sensitive adhesive layer (viewing side pressure-sensitive adhesive layer) are important. Meanwhile, in the polarizing film having a pressure-sensitive adhesive layer of the present invention, by using a polarizing layer having a thickness of 20 μm or less and the first pressure-sensitive adhesive layer, a decrease in single transmittance due to polyenization of the polarizing film in a high-temperature environment can be suppressed even when the polarizing film has a large in-plane size, and thus the polarizing film having a pressure-sensitive adhesive layer is useful.

MODE FOR CARRYING OUT THE INVENTION

Figure 1:
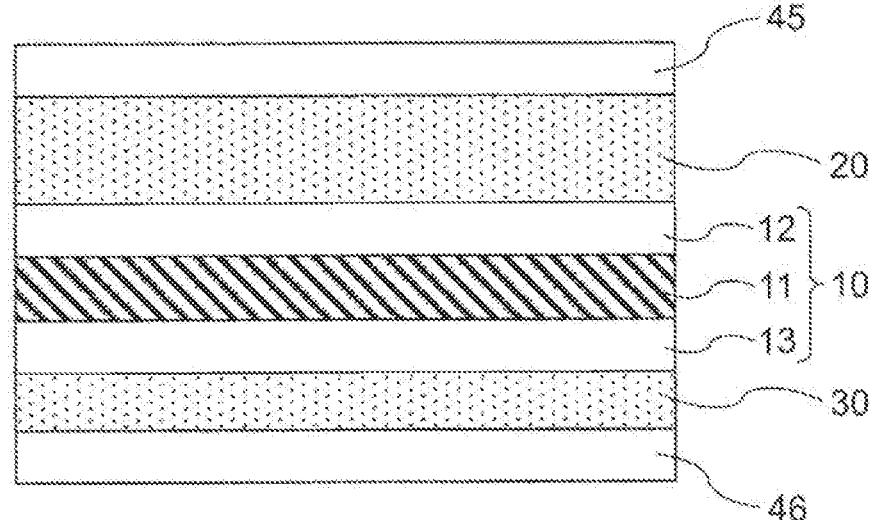
FIG. 1 is a schematic cross-sectional view showing a configuration example of a polarizing film having a pressure-sensitive adhesive layer.

FIG. 1 is a schematic cross-sectional view showing a configuration example of a polarizing film having a pressure-sensitive adhesive layer of the present invention. A polarizing film 10 includes at least a polarizing layer 11 and a first transparent protective film 12, and the polarizing film having a pressure-sensitive adhesive layer 100 includes a first pressure-sensitive adhesive layer 20 on a first transparent protective film 12 side of the polarizing film 10. The polarizing film 10 may include a second transparent protective film and a second pressure-sensitive adhesive layer 30 on a side opposite to a side having the first transparent protective film 12 of the polarizing film 10. If necessary, a separator 45 and a separator 46 may be peelably attached to each of the first pressure-sensitive adhesive layer 20 and the second pressure-sensitive adhesive layer 30.

Figure 2:
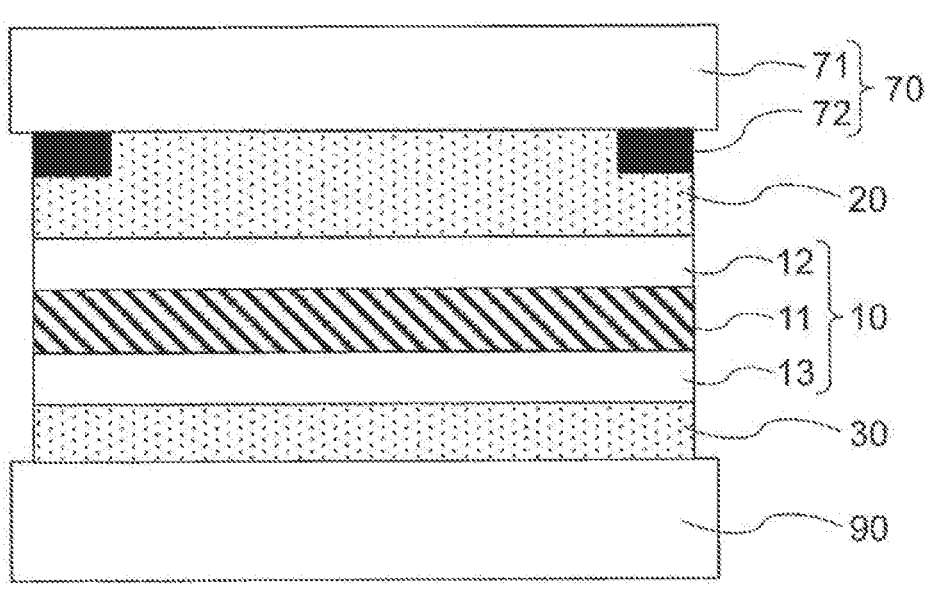
FIG. 2 is a schematic cross-sectional view showing a configuration example of an image display device including a polarizing film having a pressure-sensitive adhesive layer.

FIG. 2 is a schematic cross-sectional view showing a configuration example of an image display device including the polarizing film having a pressure-sensitive adhesive layer of the present invention. In an image display device 110, a front transparent member 70 and a polarizing film 10 are bonded to each other with a first pressure-sensitive adhesive layer 20 interposed therebetween, and an image display cell 90 and a polarizing film 10 are bonded to each other with a second pressure-sensitive adhesive layer 30 interposed therebetween. The front transparent member 70 may have a printing level difference part 72 at the peripheral part of a front transparent plate 71.

The pressure-sensitive adhesive layer 20 is a so-called "interlayer filler", and has a function of reducing a difference in refractive indexes at the interface and suppressing a decrease in visibility due to reflection and scattering of light, in addition to fixing the polarizing film 10 and the front transparent member 70. The interlayer filler also acts as a cushion layer against impact and pressing from the outer surface to the image display cell 90 such as a liquid crystal cell.

<Polarizing Film Having Pressure-Sensitive Adhesive Layer (Single-Sided Protective Polarizing Film Having Pressure-Sensitive Adhesive Layer)>

The polarizing film having a pressure-sensitive adhesive layer (single-sided protective polarizing film having a pressure-sensitive adhesive layer) of the present invention includes a first pressure-sensitive adhesive layer provided on a first transparent protective film side of a polarizing film having a polarizing layer and a first transparent protective film.

<Polarizing Layer>

The polarizing layer of the present invention is an iodine polarizing layer formed by adsorption alignment of iodine on a polyvinyl alcohol film, and has a sheet thickness of 20 μm or less. When the sheet thickness of the polarizing layer of the present invention is more than 20 μm, the amount of moisture contained in the polarizing layer tends to increase, so that a decrease in the single transmittance of a polarizing film having a polarizing layer with a large in-plane size (for example, an in-plane size of 300 cm$^2$ or more) cannot be suppressed in a high-temperature environment (for example, 95° C. for 500 hours), which is not preferable.

As the polyvinyl alcohol film, one that has translucency in a visible light band, and disperses and adsorbs iodine can be used without particular limitation. Examples of the material of the polyvinyl alcohol film include polyvinyl alcohol and derivatives thereof. Examples of the derivatives of polyvinyl alcohol include polyvinyl formal and polyvinyl acetal; olefins such as ethylene and propylene; unsaturated carboxylic acids such as acrylic acid, methacrylic acid, and crotonic acid, and those obtained by modification of such unsaturated carboxylic acids with alkyl esters, acrylamide or the like. The polyvinyl alcohol preferably has an average polymerization degree of about 100 to 10,000, more preferably has an average polymerization degree of about 1,000 to 10,000, and still more preferably has an average polymerization degree of about 1,500 to 4,500. The polyvinyl alcohol preferably has a saponification degree of about 80 to 100 mol %, and more preferably a saponification degree of about 95 mol % to 99.95 mol. The average polymerization degree and the saponification degree can be determined according to JIS K 6726.

A known method can be applied to the production of the polarizing layer, and the polarizing layer is usually obtained by subjecting a polyvinyl alcohol film to iodine dyeing and stretching. In particular, for the production of a thin polarizing layer having a thickness of 10 μm or less, a known method for producing a thin polarizing layer can be applied, which includes a step of stretching a polyvinyl alcohol resin layer and a stretching resin substrate in the form of a laminate and a step of iodine dyeing.

In the polarizing film having a pressure-sensitive adhesive layer, the in-plane size of the polarizing layer is not particularly limited. The in-plane size of the polarizing layer may be 150 cm$^2$ or more, 300 cm$^2$ or more, 600 cm$^2$ or more, or 900 cm$^2$ or more from the viewpoint of the polarizing film having a pressure-sensitive adhesive layer of the present invention being capable of suppressing a decrease in single transmittance due to polyenization in a high-temperature environment even when the in-plane size of the polarizing layer is large. Usually, the in-plane size of the polarizing film is the same as the in-plane size of the polarizing layer.

<First Transparent Protective Film>

The first transparent protective film of the present invention is not particularly limited, and various transparent protective films used for polarizing films can be used. The material for constituting the first transparent protective film is, for example, a thermoplastic resin excellent in transparency, mechanical strength, thermal stability, water blocking performance, isotropy and the like. Examples of the thermoplastic resin include cellulose ester resins such as triacetyl cellulose, polyester resins such as polyethylene terephthalate and polyethylene naphthalate, polyether sulfone resins, polysulfone resins, polycarbonate resins, polyamide resins such as nylon and aromatic polyamide, polyimide resins, polyolefin resins such as polyethylene, polypropylene, and ethylene-propylene copolymers, (meth)acryl resins, cyclic polyolefin resins having a cyclo or norbornene structure (norbornene resins), polyarylate resins, polystyrene resins, polyvinyl alcohol resins, and mixtures thereof. As the first transparent protective film, cured layers formed of thermosetting resins or ultraviolet curable resins such as (meth)acrylic resins, urethane resins, acrylic urethane resins, epoxy resins, and silicone resins can be used. Among these, cellulose ester resins, polycarbonate resins, (meth)acrylic resins, cyclic polyolefin resins, and polyester resins are preferable.

Though the thickness of the first transparent protective film can be appropriately determined, the thickness is generally preferably about 1 to 500 μm, more preferably about 1 to 300 μm, and still more preferably about 5 to 100 μm from the viewpoint of workability such as strength and handleability, thinness, and the like.

The moisture permeability of the first transparent protective film is preferably 100 g/m$^2$·24 h or more, more preferably 200 g/m$^2$·24 h or more, and still more preferably 300 g/m$^2$·24 h or more from the viewpoint of diffusing the moisture in the polarizing film out of the system to suppress a decrease in the single transmittance of the polarizing film due to polyenization, and the moisture permeability is preferably 1600 g/m$^2$·24 h or less, and more preferably 1300 g/m$^2$·24 h or less from the viewpoint of improving the humidification durability of the polarizing film. The moisture permeability can be calculated by, according to the moisture permeability test (cup method) of JIS Z0208, setting a sample cut to have a diameter of 60 mm in a moisture permeation cup containing about 15 g of calcium chloride, placing the sample in a thermostat at a temperature of 40° C. and a humidity of 90% R. H., and measuring the weight increase of calcium chloride before and after being left for 24 hours.

The polarizing layer and the first transparent protective film are usually bonded to each other with an adhesive layer interposed therebetween. As the adhesive for forming the adhesive layer, various adhesives used for polarizing films can be applied, and examples thereof include isocyanate adhesives, polyvinyl alcohol adhesives, gelatin adhesives, vinyl latex adhesives, and water polyester adhesives. These adhesives are usually used as an adhesive made of an aqueous solution, and contain 0.5 to 60% by weight of solid. In addition to the above, examples of the adhesive include active energy ray curable adhesives such as an ultraviolet curable adhesive and an electron beam curable adhesive. Examples of the active energy ray curable adhesives include (meth)acrylate adhesives agents. Examples of the curable component in the (meth)acrylate adhesives include a compound having a (meth)acryloyl group and a compound having a vinyl group. As the cationic polymerization curable adhesive, a compound having an epoxy group or an oxetanyl group can also be used. The compound having an epoxy group is not particularly limited as long as the compound has at least two epoxy groups in the molecule, and various generally known curable epoxy compounds can be used. The thickness of the adhesive layer is not particularly limited, and is preferably about 30 to 5000 nm, and more preferably about 100 to 1000 nm when a water adhesive or the like is used, and is preferably about 0.1 to 100 μm, and more preferably about 0.5 to 10 μm when an ultraviolet curable adhesive, an electron beam curable adhesive or the like is used.

<First Pressure-Sensitive Adhesive Layer (Viewing Side Pressure-Sensitive Adhesive Layer)>

The first pressure-sensitive adhesive layer of the present invention is used for bonding a front transparent member disposed on a viewing side of an image display device, and has a difference ((A)–(B)) between a saturated moisture content (A) at 80° C. and 85% R.H. and a saturated moisture content (B) at 25° C. and 50% R.H. of 1.0% by weight or more. The first pressure-sensitive adhesive layer of the present invention is used for bonding a front transparent member disposed on a viewing side of an image display device, and has a ratio ((A)/(B)) of a saturated moisture content (A) at 80° C. and 85% R.H. to a saturated moisture content (B) at 25° C. and 50% R.H. of 2.5 or less. The first pressure-sensitive adhesive layer is a pressure-sensitive adhesive sheet formed of a pressure-sensitive adhesive.

Though the first pressure-sensitive adhesive layer usually has a thickness of 50 μm or more from the viewpoint of being used for bonding a front transparent member disposed on a viewing side of an image display device, the thickness is preferably 150 μm or more, and more preferably 200 μm or more from the viewpoint of preventing generation of bubbles caused by foreign matters in a high-temperature environment (for example, 95° C. for 500 hours), from the viewpoint of increasing the moisture absorption amount, and from the viewpoint of level difference absorbability, and the thickness is preferably 600 μm or less, more preferably 500 μm or less, and still more preferably 400 μm or less from the viewpoint of productivity and the like.

Examples of the front transparent member disposed on a viewing side of the image display device include a front transparent plate (referred to as a "cover window", a "window layer" or the like.) and a touch panel. As the front transparent plate, a transparent plate having appropriate mechanical strength and thickness is used. As such a transparent plate, for example, transparent resin plates such as an acrylic resin plate and a polycarbonate resin plate, a glass plate and the like are used. As the touch panel, for example, various touch panels such as a resistive film type touch panel, a capacitance type touch panel, an optical type touch panel, and an ultrasonic type touch panel, a glass plate and a transparent resin plate having a touch sensor function and the like are used. When a capacitive type touch panel is used as the front transparent member, a front transparent plate made of glass or a transparent resin plate is preferably provided on a viewing side in a position which is outer than the touch panel.

The first pressure-sensitive adhesive layer has a difference ((A)–(B)) between a saturated moisture content (A) at 80° C. and 85% R.H. and a saturated moisture content (B) at 25° C. and 50% R.H. of 1.0% by weight or more. When the first pressure-sensitive adhesive layer has the difference ((A)–(B)) between a saturated moisture content (A) and a saturated moisture content (B) of less than 1.0% by weight, a decrease in the single transmittance of the polarizing film in a high-temperature environment (for example, 95° C. for 500 hours) cannot be suppressed. Thus, such a case is not preferable. The first pressure-sensitive adhesive layer preferably has the difference ((A)–(B)) between a saturated moisture content (A) and a saturated moisture content (B) of 1.1% by weight or more, and more preferably has the difference of 1.3% by weight or more, and from the viewpoint of a change in dielectric constant in a humidified environment, the first pressure-sensitive adhesive layer preferably has the difference of 5.0% by weight or less, and more preferably has the difference of 4.0% by weight or less. Alternatively, the first pressure-sensitive adhesive layer has a ratio ((A)/(B)) of a saturated moisture content (A) at 80° C. and 85% R.H. to a saturated moisture content (B) at 25° C. and 50% R.H. of 2.5 or less. When the first pressure-sensitive adhesive layer has a ratio ((A)/(B)) of a saturated moisture content (A) to a saturated moisture content (B) of more than 2.5, a decrease in the single transmittance of the polarizing film in a high-temperature environment (for example, 95° C. for 500 hours) cannot be suppressed. Thus, such a case is not preferable. The first pressure-sensitive adhesive layer preferably has a ratio ((A)/(B)) of a saturated moisture content (A) to a saturated moisture content (B) of 1.0 or more, more preferably has a ratio ((A)/(B)) of 2.0 or more, and preferably has a ratio ((A)/(B)) of 2.4 or less from the viewpoint of humidification cloudiness. From the viewpoint that moisture cannot be sufficiently absorbed when the saturated moisture content is too small, and from the viewpoint that the moisture absorption amount increases and components in the adhesive layer exude to bring adverse effects when the saturated moisture content is too large, the saturated moisture content (A) is preferably about 1.5 to 3.0% by weight, and more preferably about 2.0 to 2.5% by weight, and the saturated moisture content (B) is preferably about 0 to 3.0% by weight, and more preferably about 0.5 to 2.0% by weight.

The first pressure-sensitive adhesive layer preferably has high transparency. The first pressure-sensitive adhesive layer preferably has a haze value of 1% or less and preferably has a total light transmittance of 90% or more. The haze value and the total light transmittance are measured in accordance with JIS K 7136 using a haze meter.

Though the adhesive (adhesive composition) for forming the first pressure-sensitive adhesive layer is not limited as long as the pressure-sensitive adhesive satisfies the difference between saturated moisture contents, an acrylic pressure-sensitive adhesive containing an acrylic polymer as a base polymer is preferable from the viewpoint of excellent optical transparency, exhibition of appropriate adhesive properties such as wettability, cohesiveness, and adhesiveness, and excellent weather resistance, heat resistance, and the like.

The acrylic polymer has a monomer unit of a (meth) acrylic acid alkyl ester as a main skeleton. In the present specification, "(meth)acryl" means acryl and/or methacryl.

When the base polymer is a copolymer, the arrangement of constituent monomers may be random or block.

Examples of the (meth)acrylic acid alkyl ester include (meth)acrylic acid alkyl esters having an alkyl group having 1 to 20 carbon atoms. The alkyl group may be a linear or branched alkyl group or a cyclic cycloalkyl group. For the (meth)acrylic acid alkyl ester, from the viewpoint of easily controlling the difference ((A)–(B)) between a saturated moisture content (A) and a saturated moisture content (B) in the pressure-sensitive adhesive layer to 1.0% by weight or more, or from the viewpoint of easily controlling the ratio ((A)/(B)) of a saturated moisture content (A) to a saturated moisture content (B) to 2.5 or less, a (meth)acrylic acid alkyl ester having a linear or branched alkyl group having 8 or less carbon atoms is preferably used, a (meth)acrylic acid alkyl ester having a linear or branched alkyl group having 6 or less carbon atoms is more preferably used, and a (meth)acrylic acid alkyl ester having a linear or branched alkyl group having 4 or less carbon atoms is more preferably used. The (meth)acrylic acid alkyl ester can be used singly or in combination of two or more types thereof.

For the (meth)acrylic acid alkyl ester, from the viewpoint of easily controlling the difference ((A)–(B)) between a saturated moisture content (A) and a saturated moisture content (B) in the pressure-sensitive adhesive layer to 1.0% by weight or more, or from the viewpoint of easily controlling the ratio ((A)/(B)) of a saturated moisture content (A) to a saturated moisture content (B) to 2.5 or less, a (meth)acrylic acid alkyl ester having a linear or branched alkyl group and a (meth)acrylic acid alkyl ester having a cyclic cycloalkyl group are preferably used in combination. In this case, the weight ratio of the (meth)acrylic acid alkyl ester having a linear or branched alkyl group to the (meth)acrylic acid alkyl ester having a cyclic cycloalkyl group ((meth)acrylic acid alkyl ester having a linear or branched alkyl group/(meth)acrylic acid alkyl ester having a cyclic cycloalkyl group) is preferably 70/30 to 95/5, and more preferably 80/20 to 92/8.

The proportion of the (meth)acrylic acid alkyl ester is preferably 40% by weight or more, more preferably 50% by weight or more, and still more preferably 60% by weight or more in the total of monomer components that constitute the acrylic polymer.

In addition to the (meth)acrylic acid alkyl ester, the acrylic polymer preferably contains a polar monomer from the viewpoint of easily controlling the difference ((A)–(B)) between a saturated moisture content (A) and a saturated moisture content (B) in the pressure-sensitive adhesive layer to 1.0% by weight or more, or from the viewpoint of easily controlling the ratio ((A)/(B)) of a saturated moisture content (A) to a saturated moisture content (B) to 2.5 or less. Examples of the polar monomer include nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, (meth)acryloylmorpholine, N-vinylcarboxylic acid amides, and N-vinylcaprolactam; and hydroxyl group-containing monomers such as hydroxy group-containing (meth)acrylic acid esters such as 2-hydroxyethyl (meth)acrylate, 2-hydroxypropyl (meth)crylate, 4-hydroxybutyl (meth)acrylate, 6-hydroxyhexyl (meth)acrylate, 8-hydroxyoctyl (meth)acrylate, 10 hydroxydecyl (meth)acrylate, 12 hydroxylauryl (meth)acrylate, and (4-hydroxymethylcyclohexyl)-methyl acrylate. In particular, the hydroxyl group-containing monomers are preferably used as a polar monomer. The polar monomer can be used singly or in combination of two or more types thereof.

The proportion of the polar monomer is preferably 15% by weight or more, more preferably 20% by weight or more, still more preferably 30% by weight or more, and is preferably 60% by weight or less, more preferably 50% by weight or less, still more preferably 40% by weight or less in the total of monomer components that constitute the acrylic polymer.

As the monomer component that constitutes the acrylic polymer, in addition to the monomers exemplified above, other copolymerizable monomers may be used as long as the effects of the present invention are not impaired. Examples of the other copolymerizable monomers include an amino group-containing monomer, an epoxy group-containing monomer, and an aromatic vinyl monomer.

The proportion of the total of the (meth)acrylic acid alkyl ester and the polar monomer is preferably 70% by weight or more, more preferably 80% by weight or more, still more preferably 90% by weight or more, and still more preferably 95% by weight or more in the total of monomer components that constitute the acrylic polymer.

The acrylic polymer can be prepared by polymerizing the monomer components by a known polymerization method. Examples of the polymerization method of the acrylic polymer include a solution polymerization method, an emulsion polymerization method, a block polymerization method, and polymerization by irradiation with an active energy ray (active energy ray polymerization method). In terms of transparency, water resistance, cost and the like, a solution polymerization method or an active energy ray polymerization method is preferable.

In the preparation of the acrylic polymer, polymerization initiators such as a photopolymerization initiator and a thermal polymerization initiator may be used depending on the type of polymerization reaction. The molecular weight of the acrylic polymer can be appropriately adjusted. In order to impart moderate viscoelasticity and adhesiveness to the pressure-sensitive adhesive layer, the weight average molecular weight of the acrylic polymer in terms of polystyrene is preferably about 50000 to 2000000, and more preferably about 100000 to 1500000.

The proportion of the acrylic polymer in the solid content of the acrylic pressure-sensitive adhesive is preferably 70% by weight or more, more preferably 80% by weight or more, still more preferably 90% by weight or more, and still more preferably 95% by weight or more.

The pressure-sensitive adhesive layer may have a crosslinked structure as necessary. For formation of the crosslinked structure, for example, a crosslinking agent may be added to a pressure-sensitive adhesive. As the crosslinking agent, for example, commonly used crosslinking agents such as an isocyanate crosslinking agent, an epoxy crosslinking agent, an oxazoline crosslinking agent, an aziridine crosslinking agent, a carbodiimide crosslinking agent, and a metal chelate crosslinking agent can be used. The content of the crosslinking agent is usually 10 parts by weight or less, preferably 5 parts by weight or less, and more preferably 3 parts by weight or less relative to 100 parts by weight of the acrylic polymer, from the viewpoint that the flexibility (fluidity) of the pressure-sensitive adhesive is reduced, so that the adhesion to the adherend may be reduced, or ingress of bubbles or display unevenness due to the printing level difference part of the front transparent member may occur. The crosslinking agent can be used singly or in combination of two or more types thereof.

A silane coupling agent may be added to the pressure-sensitive adhesive for the purpose of adjusting adhesive force. When the silane coupling agent is used, the amount of the silane coupling agent is usually about 0.01 to 5 parts by weight, and preferably about 0.03 to 2 parts by weight relative to 100 parts by weight of the acrylic polymer. The silane coupling agent can be used singly or in combination of two or more types thereof.

The pressure-sensitive adhesive may contain a hygroscopic substance from the viewpoint of controlling the difference ((A)–(B)) between a saturated moisture content (A) and a saturated moisture content (B) or the ratio ((A)/(B)) of a saturated moisture content (A) to a saturated moisture content (B) in the pressure-sensitive adhesive layer. Examples of the hygroscopic substance include zeolite.

A tackifier may be added to the pressure-sensitive adhesive as necessary. Examples of the tackifier include a terpene tackifier, a styrene tackifier, a phenol tackifier, a rosin tackifier, an epoxy tackifier, a dicyclopentadiene tackifier, a polyamide tackifier, a ketone tackifier, and an elastomer tackifier.

Dopants such as a plasticizer, a softener, a deterioration inhibitor, a filler, a colorant, an ultraviolet absorber, an antioxidant, a surfactant, and an antistatic agent can be used in the pressure-sensitive adhesive as long as the properties of the pressure-sensitive adhesive are not impaired.

The pressure-sensitive adhesive layer is formed from the pressure-sensitive adhesive. The pressure-sensitive adhesive may be a pressure-sensitive adhesive composition having any form, and examples thereof include an emulsion type, a solvent type (solution type), an active energy ray curable type, and a heat melting type (hot melt type). Preferable examples of the pressure-sensitive adhesive include a solvent type pressure-sensitive adhesive and an active energy ray curable type (photocurable) pressure-sensitive adhesive. Preferable examples of the solvent type pressure-sensitive adhesive include pressure-sensitive adhesives containing the (meth)acrylic polymer as an essential component. Preferable examples of the active energy ray curable type pressure-sensitive adhesive include pressure-sensitive adhesives containing a mixture (monomer mixture) of monomer components that constitute the (meth)acrylic polymer or a partially polymerized product thereof as an essential component. The pressure-sensitive adhesive is preferably an active energy ray curable type (photocurable) pressure-sensitive adhesive from the viewpoint of controlling the curing timing, productivity and the like.

The active energy ray curable type (photocurable) pressure-sensitive adhesive contains a photocurable component in addition to a mixture (monomer mixture) of monomer components that constitute the (meth)acrylic polymer or a partially polymerized product thereof. As the photocurable compound, for example, a polyfunctional polymerizable compound having two or more polymerizable functional groups in one molecule is preferably used. Examples of the polyfunctional polymerizable compound include a compound having two or more C=C bonds in one molecule, and a compound having one C=C bond and a polymerizable functional group such as an epoxy group, an aziridine group, an oxazoline group, a hydrazine group, or a methylol group. The compounding ratio of the photocurable component is preferably 7 parts by weight or less, more preferably 5 parts by weight or less, and still more preferably 3 parts by weight or less relative to 100 parts by weight of the total of monomer components that constitute the acrylic polymer from the viewpoint of flexibility and adhesiveness.

Examples of the method for forming the pressure-sensitive adhesive layer include a method in which the solvent type pressure-sensitive adhesive is applied to a separator or the like and a polymerization solvent or the like is removed by drying to form a pressure-sensitive adhesive layer, a method in which the solvent type pressure-sensitive adhesive is applied to a polarizing film or the like and a polymerization solvent or the like is removed by drying to form a pressure-sensitive adhesive layer on a polarizing film or the like, and a method in which an active energy ray curable pressure-sensitive adhesive is applied to a separator or the like and irradiated with an active energy ray to form a pressure-sensitive adhesive layer.

<Polarizing Film Having Pressure-Sensitive Adhesive Layer (Double-Sided Protective Polarizing Film Having Pressure-Sensitive Adhesive Layer)>

In the polarizing film having a pressure-sensitive adhesive layer (double-sided protective polarizing film having a pressure-sensitive adhesive layer) of the present invention, the polarizing film has a second transparent protective film, and the second transparent protective film is provided on a side opposite to a side having the first transparent protective film of the polarizing film.

<Second Transparent Protective Film>

The second transparent protective film of the present invention is not particularly limited, and examples thereof include those of the first transparent protective film described above. However, the moisture permeability of the second transparent protective film is preferably 1 $g/m^2 \cdot 24$ h or more, more preferably 5 $g/m^2 \cdot 24$ h or more, and still more preferably 10 $g/m^2 \cdot 24$ h or more from the viewpoint of production efficiency in a drying step after bonding the polarizing layer and the transparent protective film, and the moisture permeability is preferably 200 $g/m^2 \cdot 24$ h or less, more preferably 180 $g/m^2 \cdot 24$ h or less, and still more preferably 150 $g/m^2 \cdot 24$ h or less from the viewpoint of allowing the first pressure-sensitive adhesive layer to absorb moisture in the polarizing film in a high-temperature environment. The polarizing layer and the second transparent protective film are usually bonded to each other with the adhesive layer interposed therebetween.

As the first transparent protective film and/or the second transparent protective film, a retardation plate having a front retardation of 40 nm or more and/or a thickness direction retardation of 80 nm or more may be used. The front retardation is usually controlled in a range of 40 to 200 nm, and the thickness direction retardation is usually controlled in a range of 80 to 300 nm. When a retardation plate is used as the transparent protective film, the retardation plate also functions as a transparent protective film, so that the thickness can be reduced.

Examples of the retardation plate include a birefringent film obtained by uniaxially or biaxially stretching a polymer material, an alignment film of a liquid crystal polymer, and one in which an alignment layer of a liquid crystal polymer is supported by a film. The thickness of the retardation plate is not particularly limited, but is generally about 20 to 150 μm. One in which the retardation plate is bonded to a transparent protective film having no retardance may be used.

The first transparent protective film and/or the second transparent protective film may contain any suitable dopants such as an ultraviolet absorber, an antioxidant, a lubricant, a plasticizer, a mold release agent, a coloring inhibitor, a flame retardant, an antistatic agent, a pigment, and a colorant.

A functional layer such as a hard coat layer, an antireflection layer, a sticking preventive layer, a diffusion layer, and an anti-glare layer can be provided on the surface of the first transparent protective film and/or the second transparent protective film to which the polarizing layer is not bonded.

The functional layer such as a hard coat layer, an antireflection layer, a sticking preventive layer, a diffusion layer, and an anti-glare layer can be provided on the protective film itself, or can be provided separately from the protective film.

The first transparent protective film and/or the second transparent protective film and the polarizing layer, or the polarizing layer and the functional layer may be laminated via an interposing layer such as a surface modification treatment layer, a highly-adhesive layer, a block layer, and a refractive index adjusting layer.

Examples of the surface modification treatment for forming the surface modification layer include corona treatment, plasma treatment, primer treatment, and saponification treatment.

Examples of the highly-adhesive for forming the highly-adhesive layer include forming materials containing various resins having a polyester skeleton, a polyether skeleton, a polycarbonate skeleton, a polyurethane skeleton, a silicone skeleton, a polyamide skeleton, a polyimide skeleton, a polyvinyl alcohol skeleton and the like.

The block layer is a layer having a function of preventing impurities such as oligomers and ions eluted from the transparent protective film or the like from migrating (entering) into the polarizing layer. The block layer may be any layer that has transparency and can prevent impurities eluted from the transparent protective film or the like, and examples of the material for forming the block layer include a urethane prepolymer forming material, a cyanoacrylate forming material, and an epoxy forming material.

The refractive index adjusting layer is a layer provided to suppress a decrease in a transmittance due to reflection between layers having different refractive indexes, such as the transparent protective film and the polarizing layer. Examples of the refractive index adjusting material for forming the refractive index adjusting layer include a forming agent containing various resins having a silica system, an acryl system, an acryl-styrene system, or a melamine system, and dopants.

<Second Pressure-Sensitive Adhesive Layer (Cell Side Pressure-Sensitive Adhesive Layer)>

In the polarizing film having a pressure-sensitive adhesive layer (double-sided protective polarizing film having a pressure-sensitive adhesive layer) of the present invention, the polarizing film has a second pressure-sensitive adhesive layer, and the second pressure-sensitive adhesive layer is provided on a side having the second transparent protective film of the polarizing layer.

As the pressure-sensitive adhesive (pressure-sensitive adhesive composition) for forming the second pressure-sensitive adhesive layer, various pressure-sensitive adhesives used in polarizing films can be applied, and those having, as a base polymer, a polymer such as an acrylic polymer, a silicone polymer, a polyester, a polyurethane, a polyamide, a polyvinyl ether, a vinyl acetate/vinyl chloride copolymer, a modified polyolefin, an epoxy polymer, a fluorine polymer, and a rubber polymer such as a natural rubber polymer and a synthetic rubber polymer can be appropriately selected and used. In particular, an acrylic pressure-sensitive adhesive containing an acrylic polymer as a base polymer is preferably used because the acrylic pressure-sensitive adhesive is excellent in optical transparency, exhibits pressure-sensitive adhesive properties such as moderate wettability, cohesiveness, and adhesiveness, and is also excellent in weather resistance, heat resistance and the like.

Though the thickness of the second pressure-sensitive adhesive layer is not particularly limited, the thickness is preferably about 3 μm to 35 μm, more preferably 5 μm to 32 μm, and still more preferably 10 μm to 30 μm from the viewpoint of adhesiveness, handleability and the like.

The first pressure-sensitive adhesive layer and/or the second pressure-sensitive adhesive layer preferably have a low content of organic acid monomers (free organic acids) such as (meth)acrylic acid. By reducing the content of organic acid monomers in the first pressure-sensitive adhesive layer, a decrease in the single transmittance of the polarizing plate due to polyenization is suppressed. The content of (meth)acrylic acid monomer in the pressure-sensitive adhesive layer is preferably 100 ppm or less, more preferably 70 ppm or less, and still more preferably 50 ppm or less. The content of organic acid monomers in the pressure-sensitive adhesive layer can be determined by immersing the pressure-sensitive adhesive layer in pure water, heating the pressure-sensitive adhesive layer at 100° C. for 45 minutes, and quantifying the acid monomers extracted in water by ion chromatography.

Usually, in a thermosetting or photocurable polymer, the presence of unreacted residual monomers is inevitable. Therefore, in order to reduce the content of acid monomers in the pressure-sensitive adhesive layer, the amount of organic acid monomer components such as (meth)acrylic acid in monomer components that constitute the base polymer is preferably reduced. The base polymer preferably does not substantially contain organic acid monomers (carboxy group-containing monomers) as a monomer unit. The proportion of the carboxy group-containing monomers is preferably 0.5% by weight or less, more preferably 0.1% by weight or less, and still more preferably 0.05% by weight or less in the total of monomer components that constitute the acrylic polymer.

A separator is peelably attached on the first pressure-sensitive adhesive layer and/or the second pressure-sensitive adhesive layer as necessary. As a constituent material of the separator, for example, plastic films such as a polyethylene film, a polypropylene film, a polyethylene terephthalate film, and a polyester film are suitably used. The substrate used for formation of the pressure-sensitive adhesive layer (application of the pressure-sensitive adhesive) may be used as it is as a separator of the pressure-sensitive adhesive layer. The peelability from the pressure-sensitive adhesive layer in practical use can be increased, particularly, by appropriately subjecting the surface of the separator to a peeling treatment such as a silicone treatment, a long-chain alkyl treatment, and a fluorine treatment.

<Image Display Device>

The image display device of the present invention is an image display device including: an image display cell; and the front transparent member, wherein the polarizing film having a pressure-sensitive adhesive layer is bonded to the front transparent member.

Examples of the image display cell include a liquid crystal cell and an organic EL cell. As the liquid crystal cell, for example, any of a reflective liquid crystal cell using external light, a transmissive liquid crystal cell using light from a light source such as a backlight, and a transflective semi-reflective liquid crystal cell using both light from the outside and light from a light source may be used. In a case where the liquid crystal cell is one using light from a light source, in the image display device (liquid crystal display device), a polarizing film is also disposed on a side opposite to a viewing side of the image display cell (liquid crystal cell), and a light source is further disposed. The polarizing film on the light source side and the liquid crystal cell are preferably bonded to each other with an appropriate adhesive layer interposed therebetween. As a driving system of the liquid crystal cell, for example, any type such as a VA mode, an IPS mode, a TN mode, an STN mode, and bend alignment (n type) can be used.

As the organic EL cell, for example, one in which a light emitter (organic electroluminescent light emitter) is formed by sequentially laminating a transparent electrode, an organic light emitting layer, and a metal electrode on a transparent substrate is suitably used. The organic light emitting layer is a laminate of various organic thin films, and various layer configurations such as a laminate of a hole injection layer composed of a triphenylamine derivative or the like and a light emitting layer composed of a fluorescent organic solid such as anthracene, a laminate of these light emitting layers and an electron injection layer composed of a perylene derivative or the like, and a laminate of a hole injection layer, a light emitting layer, and an electron injection layer can be adopted.

The polarizing film having a pressure-sensitive adhesive layer of the present invention is excellent in the effect of suppressing a decrease in single transmittance due to polyenization of a polarizing layer in a high-temperature environment, and is therefore suitable for use in in-vehicle image display devices such as car navigation devices and back monitors.

EXAMPLES

Hereinafter, the present invention will be described in more detail with reference to Examples, but the present invention is not limited only to these Examples.

<Preparation of First Pressure-Sensitive Adhesive Layer>
<Pressure-Sensitive Adhesive Layer A>

To a monomer mixture composed of 60 parts by weight of butyl acrylate (BA), 6 parts by weight of cyclohexyl acrylate (CHA), 26 parts by weight of 4-hydroxybutyl acrylate (4HBA), and 8 parts by weight of hydroxyethyl acrylate (HEA), 0.09 parts by weight of 2, 2-dimethoxy-1, 2-diphenyl-1-one (trade name: "Irgacure 651", manufactured by BASF Japan Ltd.) and 0.09 parts by weight of 1-hydroxy-cyclohexyl-phenyl-ketone (trade name: "Irgacure 184", manufactured by BASF Japan Ltd.) were charged in a four-necked flask. This system was exposed to ultraviolet rays in a nitrogen atmosphere to photopolymerize the monomer components in a partial quantity thereof. In this way, a partially polymerized product (monomer syrup) was yielded which had a polymerization rate of about 10%. To 100 parts by weight of this partially polymerized product, 0.12 parts by weight of dipentaerythritol hexaacrylate ("KAYARAD DPHA" manufactured by Nippon Kayaku Co., Ltd.) as a polyfunctional polymerizable compound and 0.3 parts by weight of 3-glycidoxypropyltrimethoxysilane ("KBM-403" manufactured by Shin-Etsu Chemical Co., Ltd.) as a silane coupling agent were added, and the mixture was mixed uniformly to prepare a pressure-sensitive adhesive (pressure-sensitive adhesive composition). The obtained pressure-sensitive adhesive was applied onto a peeling-treated surface of a separator (a type in which one side of a polyethylene terephthalate film is peeling-treated, thickness: 38 μm, trade name "MRF 38", manufactured by Mitsubishi Plastics, Inc.) to form a coating layer, and then the same separator was provided on the coating layer. Subsequently, polymerization was performed with ultraviolet rays having an intensity of 5 mW/cm$^2$ using a black light until irradiation of an integrated light amount of 3600 mJ/cm$^2$ to produce a first pressure-sensitive adhesive layer provided with separators on both surfaces. The thickness of the first pressure-sensitive adhesive layer was set to the thickness shown in Table 1 by adjusting the application amount.

<Pressure-Sensitive Adhesive Layer B>

To a monomer mixture composed of 67 parts by weight of 2-ethylhexyl acrylate (2EHA), 15 parts by weight of N-vinyl-2-pyrrolidone (NVP), 3 parts by weight of 2-hydroxyethyl acrylate (HEA), and 15 parts by weight of 4-hydroxybutyl acrylate (4HBA), 0.035 parts by weight of 2,2-dimethoxy-1, 2-diphenyl-1-one (trade name: "Irgacure 651", manufactured by BASF Japan Ltd.) and 0.035 parts by weight of 1-hydroxy-cyclohexyl-phenyl-ketone (trade name: "Irgacure 184", manufactured by BASF Japan Ltd.) were charged in a four-necked flask. This system was exposed to ultraviolet rays in a nitrogen atmosphere to photopolymerize the monomer components in a partial quantity thereof. In this way, a partially polymerized product (monomer syrup) was yielded which had a polymerization rate of about 10%. To 100 parts by weight of this partially polymerized product, 0.3 parts by weight of 1, 6-hexanediol diacrylate ("NK Ester A-HD-N" manufactured by SHIN-NAKAMURA CHEMICAL CO, LTD.) as a polyfunctional polymerizable compound and 0.3 parts by weight of 3-glycidoxypropyltrimethoxysilane ("KBM-403" manufactured by Shin-Etsu Chemical Co., Ltd.) as a silane coupling agent were added, and the mixture was mixed uniformly to prepare a pressure-sensitive adhesive (pressure-sensitive adhesive composition). The obtained pressure-sensitive adhesive was applied onto a peeling-treated surface of a separator (a type in which one side of a polyethylene terephthalate film is peeling-treated, thickness: 38 μm, trade name "MRF 38", manufactured by Mitsubishi Plastics, Inc.) to form a coating layer, and then the same separator was provided on the coating layer. Subsequently, polymerization was performed with ultraviolet rays having an intensity of 5 mW/cm$^2$ using a black light until irradiation of an integrated light amount of 3600 mJ/cm$^2$ to produce a first pressure-sensitive adhesive layer provided with separators on both surfaces. The thickness of the first pressure-sensitive adhesive layer was set to the thickness shown in Table 1 by adjusting the application amount.

<Pressure-Sensitive Adhesive Layer C>

To a monomer mixture composed of 40 parts by weight of 2-ethylhexyl acrylate (2EHA), 40 parts by weight of isostearyl acrylate (ISTA), 18 parts by weight of N-vinyl-2-pyrrolidone (NVP), and 2 parts by weight of 4-hydroxybutyl acrylate (4HBA), 0.05 parts by weight of 2,2-dimethoxy-1, 2-diphenyl-1-one (trade name: "Irgacure 651", manufactured by BASF Japan Ltd.) and 0.05 parts by weight of 1-hydroxy-cyclohexyl-phenyl-ketone (trade name: "Irgacure 184", manufactured by BASF Japan Ltd.) were charged in a four-necked flask. This system was exposed to ultraviolet rays in a nitrogen atmosphere to photopolymerize the monomer components in a partial quantity thereof. In this way, a partially polymerized product (monomer syrup) was yielded which had a polymerization rate of about 10%. To 100 parts by weight of this partially polymerized product, 0.02 parts by weight of trimethylolpropane triacrylate ("TMP3A" manufactured by OSAKA ORGANIC CHEMICAL INDUSTRY LTD.) as a polyfunctional polymerizable compound and 0.3 parts by weight of 3-glycidoxypropyltrimethoxysilane ("KBM-403" manufactured by Shin-Etsu Chemical Co., Ltd.) as a silane coupling agent were added, and the mixture was mixed uniformly to prepare a pressure-sensitive adhesive (pressure-sensitive adhesive composition). The obtained pressure-sensitive adhesive was applied onto a peeling-treated surface of a separator (a type in which one side of a polyethylene terephthalate film is peeling-treated, thickness: 38 μm, trade name "MRF 38", manufactured by Mitsubishi Plastics, Inc.) to form a coating layer, and then the same separator was provided on the coating layer. Subsequently, polymerization was performed with ultraviolet rays having an intensity of 5 mW/cm$^2$ using a black light until irradiation of an integrated light amount of 3600 mJ/cm$^2$ to produce a first pressure-sensitive adhesive layer provided with separators on both surfaces. The thickness of the first pressure-sensitive adhesive layer was set to the thickness shown in Table 1 by adjusting the application amount.

Example 1

<Production of Polarizing Layer>
<Polarizing Layer A>

A polyvinyl alcohol film having an average polymerization degree of 2,400, a saponification degree of 99.9 mol %, and a thickness of 45 μm was prepared. The polyvinyl alcohol film was stretched 2.2 times in the transport direction while being immersed and swollen in a swelling bath (water bath) at 20° C. for 30 seconds between rolls having different peripheral speed ratios (swelling step), and subsequently was stretched 3.3 times in the transport direction based on the original polyvinyl alcohol film (polyvinyl alcohol film not stretched at all in the transport direction) while being immersed and dyed in a dyeing bath (aqueous solution having an iodine concentration of 0.1% by weight and a potassium iodide concentration of 0.9% by weight) at 30° C. for 30 seconds (dyeing step). Then, the dyed polyvinyl alcohol film was immersed in a crosslinking bath (aqueous solution having a boric acid concentration of 3.0% by weight and a potassium iodide concentration of 3.0% by weight) at 40° C. for 28 seconds, and stretched 3.6 times in the transport direction based on the original polyvinyl alcohol film (crosslinking step). Further, the obtained polyvinyl alcohol film was immersed in a stretching bath (aqueous solution having a boric acid concentration of 4.0% by weight and a potassium iodide concentration of 5.0% by weight) at 61° C. for 60 seconds and stretched 6.0 times in the transport direction based on the original polyvinyl alcohol film (stretching step), and then immersed in a washing bath (aqueous solution having a potassium iodide concentration of 2.0% by weight) at 20° C. for 10 seconds (washing step). The washed polyvinyl alcohol film was dried at 40° C. for 30 seconds to produce a polarizing layer. The iodine content determined by the following measurement method was 2.8% by weight. The thickness of the polarizing layer was 18 μm.
[Measurement Method of Iodine Concentration (% by Weight) in Polarizing Layer]

The iodine concentration (% by weight) of the polarizing layer was determined using the following formula using an X-ray fluorescence analyzer (manufactured by Rigaku Corporation, trade name "ZSX-PRIMUS IV", measurement diameter: ψ 20 mm).

Iodine concentration (wt %)=14.474×(X-ray fluorescence intensity)/(film thickness) (kcps/μm). The coefficient in calculating the concentration varies depending on the measurement device, and the coefficient can be determined using an appropriate calibration curve.
<Production of Polarizing Film Having Pressure-Sensitive Adhesive Layer>

As an adhesive, an aqueous solution containing a polyvinyl alcohol resin (the average polymerization degree: 1,200, the saponification degree: 98.5 mol %, the acetoacetylation degree: 5 mol %.) containing an acetoacetyl group and methylolmelamine at a weight ratio of 3:1 was used. Using this adhesive, a 30 μm-thick transparent protective film (manufactured by NIPPON SHOKUBAI CO., LTD., moisture permeability: 125 g/(m$^2$·24 h)) composed of a (meth)acrylic resin (modified acrylic polymer having a lactone ring structure) as a second transparent protective film was bonded to one surface (image display device cell side) of the polarizing layer obtained above, a 49 μm-thick transparent protective film (moisture permeability: 300 g/(m$^2$·24 h)) in which HC is formed on a triacetyl cellulose film (trade name "TJ 40 UL" manufactured by FUJIFILM Corporation) as a first transparent protective film was bonded to the other surface (viewing side) with a roll bonding machine, and then the product was heated and dried (temperature: 90° C., time: 10 minutes) in an oven to produce a polarizing film in which transparent protective films are bonded to both surfaces of a polarizing layer. The single transmittance of the polarizing film was 41.7%. Then, the separators of the first pressure-sensitive adhesive layer provided with separators on both surfaces obtained above were peeled off, and the pressure-sensitive adhesive layer was bonded on the first transparent protective film of the obtained polarizing film to produce a polarizing film having a pressure-sensitive adhesive layer.
[Measurement Method of Saturated Moisture Content]

The first pressure-sensitive adhesive layer obtained above was cut into a size of 1 cm×1 cm, the separators were peeled off, and the first pressure-sensitive adhesive layer was bonded to an aluminum foil to prepare an evaluation sample. The weight (W1) of the sample in a state where the moisture was completely removed by leaving the first pressure-sensitive adhesive layer to stand in an environment of 95° C. and 0% R.H. until there was no weight change was measured using a moisture adsorption/desorption measuring apparatus (IGA-Sorp, manufactured by Hiden Analytical), the sample was left to stand in an environment of 80° C. and 85% R.H., and a weight change was observed. When the weight change of the sample came not to be observed (saturated state), the weight (W2) thereof was measured. The saturated moisture content (saturated moisture content (A)) was measured by the following formula, the saturated moisture content (B) at 25° C. and 50% R.H. was measured in the same procedure, and the difference ((A)−(B)) was calculated. The results are shown in Table 1.

[Mathematical formula 1]

$$\text{Saturated moisture content (\% by weight)} = \frac{W2 - W1}{W1} \times 100$$

[Evaluation of Single Transmittance in High-Temperature Environment (1)]

The polarizing film having a pressure-sensitive adhesive layer obtained above was cut into a size of 20×15 cm (in-plane size: 300 cm$^2$) so that the absorption axis of the polarizing layer was on the long side, a glass plate (simulated image display cell) was bonded to the surface of the second transparent protective film of the polarizing film with an acrylic pressure-sensitive adhesive layer having a thickness of 20 μm as a second pressure-sensitive adhesive layer interposed therebetween, and the polarizing film was bonded to another glass plate (front transparent member) with a first pressure-sensitive adhesive layer from which separators were peeled off interposed therebetween to produce a laminate (simulated image display device). The obtained laminate was allowed to stand in a hot air oven at a temperature of 95° C. for 500 hours, and the single transmittances (ΔTs)

before and after charging (heating) were measured. The single transmittances were measured using a spectrophotometer (manufactured by MURAKAMI COLOR RESEARCH LABORATORY CO., LTD., trade name "DOT-3") and evaluated according to the following criteria. The single transmittances are Y values obtained by performing visibility correction using a 2 degree field of view (C light source) of JIS Z 8701-1982. The measurement wavelength was 380 to 700 nm (every 10 nm). The results are shown in Table 1.

$$\Delta Ts(\%)=Ts_{500}-Ts_0$$

$Ts_0$ is the single transmittance of the laminate before heating, and $Ts_{500}$ is the single transmittance of the laminate after heating for 500 hours.

⊙: $\Delta Ts$ (%) is 0% or more and 5% or less.

○: $\Delta Ts$ (%) is −1% or more and less than 0%.

Δ: $\Delta Ts$ (%) is −2% or more and less than −1%.

x: $\Delta Ts$ (%) is less than −2% or more than 5%.

[Evaluation of Single Transmittance in High-Temperature Environment (2)]

The same operations as in the above [Evaluation of single transmittance in high-temperature environment (1)] were performed except that the laminate was allowed to stand in a hot air oven at a temperature of 95° C. for 1000 hours instead of the laminate being allowed to stand in a hot air oven at a temperature of 95° C. for 500 hours in the above [Evaluation of single transmittance in high-temperature environment (1)], and the single transmittances were evaluated according to the following criteria.

$$\Delta Ts(\%)=Ts_{1000}-Ts_0$$

$Ts_0$ is the single transmittance of the laminate before heating, and $Ts_{1000}$ is the single transmittance of the laminate after heating for 1000 hours.

⊙: $\Delta Ts$ (%) is 0% or more and 5% or less.

○: $\Delta Ts$ (%) is −1% or more and less than 0%.

A: $\Delta Ts$ (%) is −2% or more and less than −1%.

x: $\Delta Ts$ (%) is less than −2% or more than 5%.

[Evaluation of Generation of Bubbles Caused by Foreign Matters]

In <Production of polarizing film having pressure-sensitive adhesive layer> described above, simulated foreign matters (glass) having an average particle size of 150 μm were mixed on the first transparent protective film of the obtained polarizing film, and the first pressure-sensitive adhesive layer was bonded to produce a polarizing film having a pressure-sensitive adhesive layer. The obtained polarizing film having a pressure-sensitive adhesive layer was cut into a size of 20×15 cm (in-plane size: 300 cm²) so that the absorption axis of the polarizing layer was on the long side, a glass plate (simulated image display cell) was bonded to the surface of the second transparent protective film of the polarizing film with an acrylic pressure-sensitive adhesive layer having a thickness of 20 μm as a second pressure-sensitive adhesive layer interposed therebetween, and the polarizing film was bonded to another glass plate (front transparent member) with a first pressure-sensitive adhesive layer from which separators were peeled off interposed therebetween to produce a laminate (simulated image display device). The obtained laminate was allowed to stand in a hot air oven at a temperature of 95° C. for 500 hours, and then the generation of bubbles caused by foreign matters was evaluated according to the following criteria. The results are shown in Table 1.

○: No bubble is generated.

Δ: Bubbles are less than 100 μm.

x: Bubble growth is 100 μm or more.

[Measurement of Haze Value]

The release films on both surfaces were peeled off from the first pressure-sensitive adhesive layer provided with separators on both surfaces produced above, and the pressure-sensitive adhesive layer was bonded to a slide glass (trade name: White Polishing No. 1, thickness: 0.8 to 1.0 mm, total light transmittance: 92%, haze: 0.2%, manufactured by Matsunami Glass Ind., Ltd.) to produce a test piece having a layer configuration of slide glass/pressure-sensitive adhesive layer/slide glass. The test piece was allowed to stand in an environment at 85° C. and 85% R.H. for 1000 hours, and the haze values in the visible light band at the initial stage (X) and after being allowed to stand (Y) were measured using a haze meter (device name: HM-150, manufactured by MURAKAMI COLOR RESEARCH LABORATORY CO., LTD.). The results are shown in Table 1. The first pressure-sensitive adhesive layer of the present invention preferably has a haze value before being allowed to stand in an environment at 85° C. and 85% R.H. for 1000 hours (initial state) of 1.5 or less, and more preferably a haze value before being allowed to stand in an environment at 85° C. and 85% R.H. for 1000 hours (initial state) of 1.0 or less, and preferably has a haze value after being allowed to stand in an environment at 85° C. and 85% R. H. for 1000 hours of 3.0 or less, and more preferably a haze value after being allowed to stand in an environment at 85° C. and 85% R.H. for 1000 hours of 2.0 or less, and preferably has a difference between the haze values before and after being allowed to stand in an environment at 85° C. and 85% R.H. for 1000 hours of 1.5 or less, and more preferably has a difference between the haze values before and after being allowed to stand in an environment at 85° C. and 85% R. H. for 1000 hours of 1.0 or less.

Examples 2 to 9 and Comparative Examples 1 to 4

In Examples 2 to 9 and Comparative Examples 1 to 4, the same operations as in Example 1 were performed except that the type (thickness) of the polarizing layer, the in-plane size of the polarizing layer, and the type and thickness of the first pressure-sensitive adhesive layer were changed to the values shown in Table 1, and the above evaluations were performed. The results are shown in Table 1. The in-plane size 150 cm² of the polarizing layer is 15 cm×10 cm, the in-plane size 600 cm² is 30 cm×20 cm, and the in-plane size 900 cm² is 50 cm×18 cm. The production of the polarizing layer B will be described below.

<Production of Polarizing Layer>

<Polarizing Layer B>

A polarizing layer and a polarizing film were produced by the same operations as in Example 1 except that in the production of the polarizing layer, a polyvinyl alcohol film having a thickness of 75 μm was stretched 2.2 times in the transport direction while being immersed and swollen in a swelling bath (water bath) at 35° C. for 30 seconds between rolls having different peripheral speed ratios (swelling step), and the iodine concentration of the dyeing bath was adjusted so that the iodine concentration of the finally obtained polarizing layer would be 2.5% by weight. The thickness of the obtained polarizing layer was 28 μm. The single transmittance of the obtained polarizing film was 41.7%.

TABLE 1

| | | Polarizing | | | First pressure-sensitive adhesive layer | | | | | | | First transparent protective film | Evaluation | | |
| | | | Sheet thick-ness (μm) | In-plane size (cm²) | | Saturated moisture content (A) at 80° C. and 85% R.H. (wt %) | Saturated moisture content (B) at 25° C. and 50% R.H. (wt %) | (A)-(B) | Haze value (X) at 85° C. and 85% R.H.× 1000 h | Initial haze value (Y) | (X)-(Y) | Thick-ness (μm) | Mois-ture perme-ability (g/m²· 24 h) | Single trans-mittance (95° C. × 500 h) | Single trans-mittance (95° C. × 1000 h) | Gene-ration of bubbles caused by foreign matters |
| | | Type | | | Type | | | | | | | | | | | |
|---|---|---|---|---|---|---|---|---|---|---|---|---|---|---|---|---|
| Ex-am-ple | 1 | Polar-izing A | 18 | 300 | Pressure-sensitive adhesive layer A | 2.4 | 1.0 | 1.4 | 0.4 | 0.3 | 0.1 | 150 | 300 | ⊙ | ⊙ | ○ |
| | 2 | Polar-izing A | 18 | 300 | Pressure-sensitive adhesive layer A | 2.4 | 1.0 | 1.4 | 0.4 | 0.3 | 0.1 | 250 | 300 | ⊙ | ⊙ | ○ |
| | 3 | Polar-izing A | 18 | 300 | Pressure-sensitive adhesive layer A | 2.4 | 1.0 | 1.4 | 0.4 | 0.3 | 0.1 | 50 0 | 300 | ⊙ | ⊙ | ○ |
| | 4 | Polar-izing A | 18 | 300 | Pressure-sensitive adhesive layer B | 2.2 | 1.0 | 1.2 | 0.4 | 0.3 | 0.1 | 250 | 300 | ○ | Δ | ○ |
| | 5 | Polar-izing A | 18 | 300 | Pressure-sensitive adhesive layer A | 2.4 | 1.0 | 1.4 | 0.4 | 0.3 | 0.1 | 100 | 300 | ⊙ | ⊙ | Δ |
| | 6 | Polar-izing A | 18 | 600 | Pressure-sensitive adhesive layer A | 2.4 | 1.0 | 1.4 | 0.4 | 0.3 | 0.1 | 250 | 300 | ⊙ | ○ | ○ |
| | 7 | Polar-izing A | 18 | 150 | Pressure-sensitive adhesive layer A | 2.4 | 1.0 | 1.4 | 0.4 | 0.3 | 0.1 | 250 | 300 | ⊙ | ⊙ | ○ |
| | 8 | Polar-izing A | 18 | 900 | Pressure-sensitive adhesive layer A | 2.4 | 1.0 | 1.4 | 0.4 | 0.3 | 0.1 | 250 | 300 | ⊙ | ○ | ○ |
| | 9 | Polar-izing A | 18 | 900 | pressure-sensitive adhesive layer B | 2.2 | 1.0 | 1.2 | 0.4 | 0.3 | 0.1 | 250 | 300 | ○ | Δ | ○ |
| Com-par-ative ex-am-ple | 1 | Polar-izing A | 18 | 300 | Pressure-sensitive adhesive layer C | 1.3 | 0.5 | 0.8 | 3.6 | 0.3 | 3.3 | 250 | 300 | X | X | ○ |
| | 2 | Polar-izing A | 18 | 50 | Pressure-sensitive adhesive layer C | 1.3 | 0.5 | 0.8 | 3.6 | 0.3 | 3.3 | 250 | 300 | Δ | X | ○ |
| | 3 | Polar-izing B | 28 | 300 | Pressure-sensitive adhesive layer B | 2.2 | 1.0 | 1.2 | 0.4 | 0.3 | 0.1 | 250 | 300 | X | X | ○ |
| | 4 | Polar-izing B | 28 | 300 | Pressure-sensitive adhesive layer A | 2.4 | 1.0 | 1.4 | 0.4 | 0.3 | 0.1 | 250 | 300 | Δ | X | ○ |

In the polarizing film having a pressure-sensitive adhesive layers of Examples 1 to 9, the sheet thickness of the polarizing layer is 20 μm or less, and the first pressure-sensitive adhesive layer is used for bonding a front transparent member disposed on a viewing side of an image display device and has a difference ((A)−(B)) between a saturated moisture content (A) at 80° C. and 85% R.H. and a saturated moisture content (B) at 25° C. and 50% R.H. of 1.0% by weight or more, or a ratio ((A)/(B)) of a saturated moisture content (A) at 80° C. and 85% R.H. to a saturated moisture content (B) at 25° C. and 50% R.H. of 2.5 or less. Thus, in the Evaluation of single transmittance in high-temperature environment (1), the polarizing films having a pressure-sensitive adhesive layer exhibited good results of ⊙ or ○. In particular, the polarizing films having a pressure-sensitive adhesive layer of Examples 1 to 3 and 5 to 8 exhibited good results of ⊙ or ○ in the Evaluation of single transmittance in high-temperature environment (2).

Meanwhile, in the polarizing films having a pressure-sensitive adhesive layer of Comparative Example 1 to 2, the difference ((A)−(B)) between saturated moisture contents was 0.8% by weight, and thus in the Evaluation of single transmittance in high-temperature environment (1), the polarizing films having a pressure-sensitive adhesive layer exhibited poor results of Δ or x. In the polarizing films having a pressure-sensitive adhesive layer of Comparative Examples 3 to 4, the sheet thickness of the polarizing layer was 28 μm, and thus in the Evaluation of single transmittance in high-temperature environment (1), the polarizing films having a pressure-sensitive adhesive layer exhibited poor results of Δ or x.

DESCRIPTION OF REFERENCE SIGNS

10 Polarizing film
11 Polarizing layer
12 First transparent protective film
13 Second transparent protective film
20 First pressure-sensitive adhesive layer
30 Second pressure-sensitive adhesive layer
45, 46 Separator
70 Front transparent member
71 Front transparent plate
72 Printing level difference part
90 Image display cell
100 Polarizing film having a pressure-sensitive adhesive layer
110 Image display device

The invention claimed is:

1. A polarizing film having a pressure-sensitive adhesive layer, comprising:
   a first pressure-sensitive adhesive layer provided on a first transparent protective film side of a polarizing film having a polarizing layer and a first transparent protective film,
   wherein the polarizing layer has a sheet thickness of 20 μm or less,
   the first pressure-sensitive adhesive layer is used for bonding a front transparent member disposed on a viewing side of an image display device,
   the first pressure-sensitive adhesive layer has a difference ((A)−(B)) between a saturated moisture content (A) at 80° C. and 85% R.H. and a saturated moisture content (B) at 25° C. and 50% R.H. of 1.0% by weight or more, and
   the first pressure-sensitive adhesive layer has a ratio ((A)/(B)) of the saturated moisture content (A) at 80° C. and 85% R.H. to the saturated moisture content (B) at 25° C. and 50% R.H. of 2.5 or less, and
   wherein the saturated moisture content (A) is 1.5% by weight or more and 3.0% by weight or less.

2. The polarizing film having a pressure-sensitive adhesive layer according to claim 1, wherein the first pressure-sensitive adhesive layer has a thickness of 150 μm or more and 600 μm or less.

3. The polarizing film having a pressure-sensitive adhesive layer according to claim 1, wherein the first transparent protective film has a moisture permeability of 100 g/m²·24 h or more.

4. The polarizing film having a pressure-sensitive adhesive layer according to claim 1, wherein
   the polarizing layer has an in-plane size of 300 cm² or more.

5. The polarizing film having a pressure-sensitive adhesive layer according to claim 1, wherein the polarizing film has a second transparent protective film, and
   the second transparent protective film is provided on a side opposite to a side having the first transparent protective film of the polarizing film.

6. The polarizing film having a pressure-sensitive adhesive layer according to claim 5, wherein
   the polarizing film has a second pressure-sensitive adhesive layer, and
   the second pressure-sensitive adhesive layer is provided on a side having the second transparent protective film of the polarizing film.

7. The polarizing film having a pressure-sensitive adhesive layer according to claim 6, wherein the second pressure-sensitive adhesive layer has a thickness of 3 μm or more and 35 μm or less.

8. An image display device, comprising:
   an image display cell; and
   the front transparent member,
   wherein the polarizing film having a pressure-sensitive adhesive layer according to claim 1 is bonded to the front transparent member.

* * * * *